United States Patent [19]

Nicholas

[11] Patent Number: 5,047,360
[45] Date of Patent: Sep. 10, 1991

[54] METHOD OF MANUFACTURE THIN FILM TRANSISTORS

[75] Inventor: Keith H. Nicholas, Reigate, England

[73] Assignee: U.S. Philips Corporation, New York, N.Y.

[21] Appl. No.: 390,850

[22] Filed: Aug. 8, 1989

[30] Foreign Application Priority Data

Sep. 30, 1988 [GB] United Kingdom ............... 8822960

[51] Int. Cl.⁵ .......................................... H01L 21/336
[52] U.S. Cl. .................................... 437/40; 437/21; 437/984; 437/29; 148/DIG. 18; 148/DIG. 105
[58] Field of Search ............... 437/40, 23, 24, 25, 437/26, 181, 155, 918, 922, 931, 948, 953, 962, 29, 21, 45, 101, 984; 148/DIG. 1, DIG. 18, DIG. 98, DIG. 103, DIG. 104, DIG. 105, DIG. 106; 357/23.7

[56] References Cited

U.S. PATENT DOCUMENTS

| | | |
|---|---|---|
| 4,276,095 | 6/1981 | Beilstein, Jr. et al. ............... 437/45 |
| 4,459,739 | 7/1984 | Shepherd et al. ...................... 437/25 |
| 4,624,737 | 11/1986 | Shimbo ................................ 437/1812 |
| 4,700,458 | 10/1987 | Suzuki et al. ......................... 437/83 |
| 4,704,783 | 11/1987 | Possin et al. .......................... 437/40 |
| 4,738,749 | 4/1988 | Maurice et al. ...................... 156/652 |
| 4,788,560 | 10/1988 | Takeda et al. ....................... 156/643 |
| 4,797,108 | 1/1989 | Crowther ............................... 437/41 |
| 4,882,295 | 11/1989 | Czubatyj et al. .................... 437/101 |

FOREIGN PATENT DOCUMENTS 58-33872 2/1983 Japan ..................................... 437/21

OTHER PUBLICATIONS

European Search Report, EP 89 20 2406.

Primary Examiner—Brian E. Hearn
Assistant Examiner—T. N. Quach
Attorney, Agent, or Firm—Paul R. Miller

[57] ABSTRACT

A TFT is fabricated by providing on a substrate (10), and over a gate (12), a sequentially formed multi-layer structure consisting of a gate insulator layer (14), an intrinsic semiconductor, e.g. a-Si or polysilicon, layer (16) for the channel, a doped semiconductor, e.g. n type a-Si or polysilicon, layer (18) for source and drain contact regions and a passivating layer (20). The layer (18) extends completely over and covers the channel region of the layer (16). Thereafter, the portion (30) of layer (18) overlying the channel region is converted by a compensating doping implant to a highly resistive form separating the source and drain contact regions, and windows (22, 24) are defined in the passivating layer (20) into which source and drain contacts (26, 28) are deposited. In this way critical interfaces are protected from contamination. The TFT is suitable for use as a switching element in active matrix display devices, e.g. LC-TVs.

5 Claims, 3 Drawing Sheets

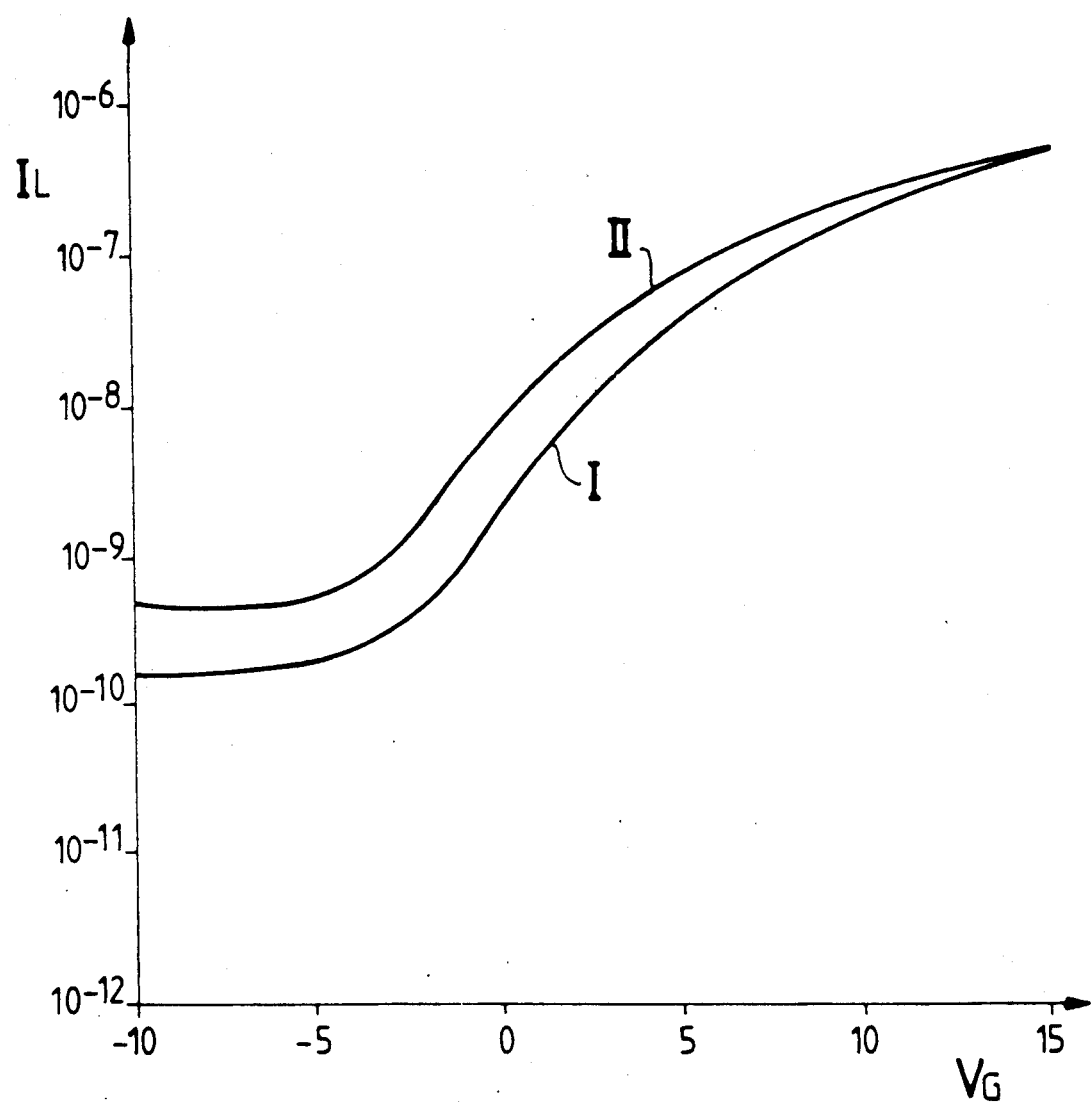

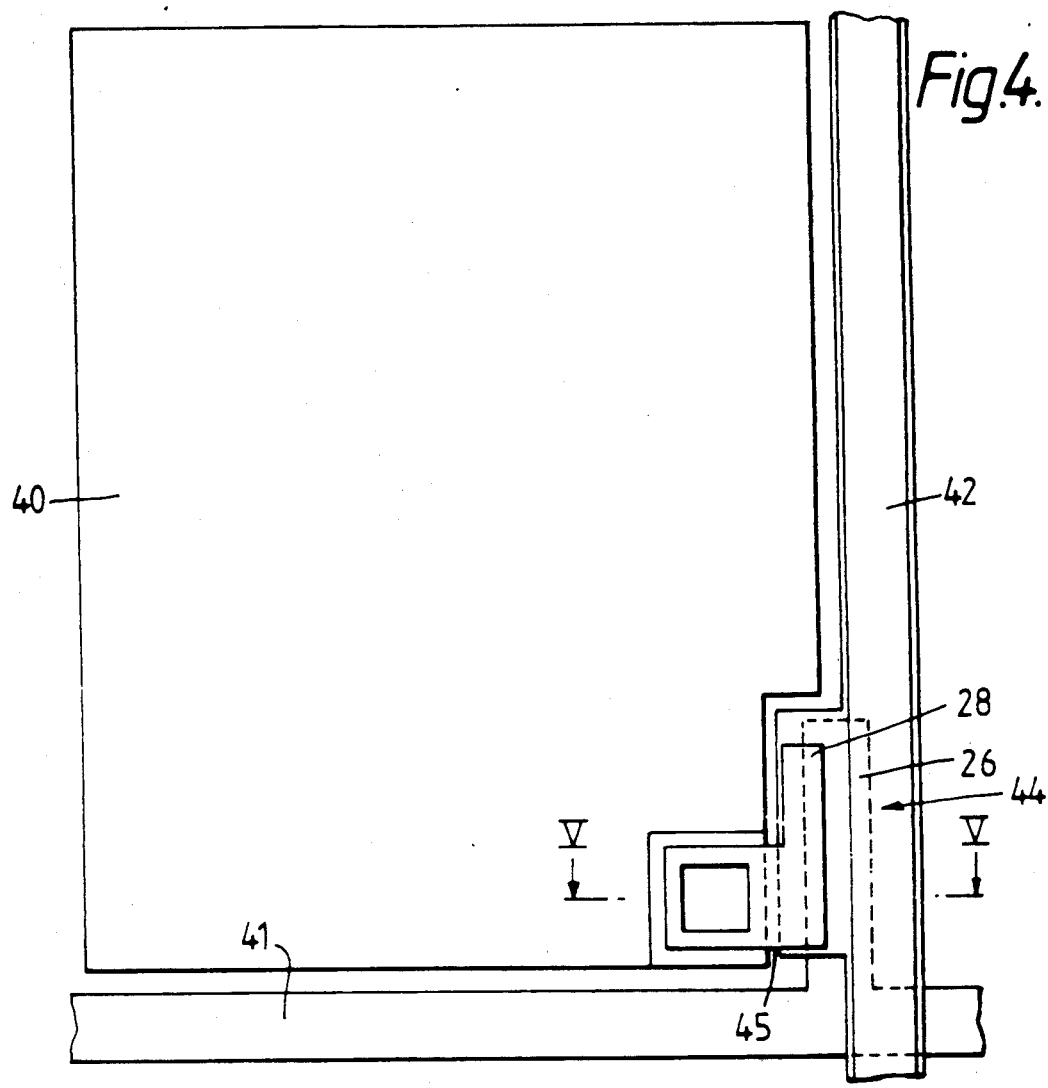
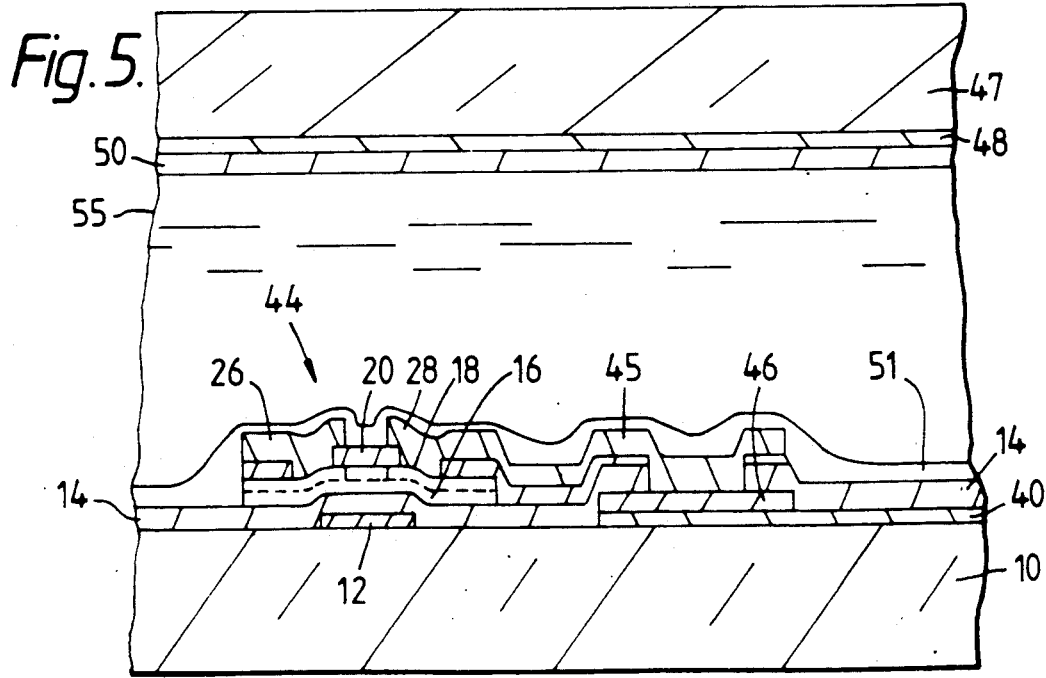

METHOD OF MANUFACTURE THIN FILM TRANSISTORS

This invention relates to thin film transistors and methods for their fabrication. The invention is concerned particularly, although not exclusively, with thin film transistors suitable for use as switching elements in active matrix addressed display devices.

BACKGROUND OF THE INVENTION

In a known method of manufacturing a thin film transistor, TFT, and in particular an amorphous silicon TFT of the so-called inverted staggered type suitable for use as a switching element in a display device, layers of insulative material (silicon nitride), undoped amorphous silicon and n-type amorphous silicon are consecutively grown on a substrate provided with a defined metallic layer constituting a gate. Subsequently one or more further metallic layers, for example of chromium and/or aluminium, are deposited over this multi-layer structure and defined by selective etching, using a mask, to form the source and drain contacts. At the same time a portion of the n-type amorphous silicon layer extending between the source and drain contacts and above the channel region is etched away before a final passivation layer is deposited over the contacts and the exposed surface of the intrinsic amorphous silicon layer so as to contact directly with the intrinsic layer over the channel region.

In another known method of producing an inverted staggered type of thin film transistor intended for similar purposes, overlying layers of insulative material (silicon nitride) and undoped amorphous silicon and another insulative layer of silicon nitride are consecutively deposited on a substrate carrying the defined gate. Portions of the upper nitride layer to either side of the eventual channel region are removed by selective etching to expose underlying areas of the intrinsic silicon layer and define the desired contact regions prior to deposition and selective etching of an n-type amorphous silicon layer and metallisation (chromium and aluminium layers) for the source and drain contacts. A portion of the upper nitride layer remains over the channel region. A passivation layer is subsequently deposited over all exposed surfaces.

In a typical active matrix addressed display device, for example a liquid crystal display device suitable for TV display purposes, having one thin film transistor for each picture element, many thousands of such transistors are fabricated together on a single substrate with the appropriate address conductors and picture element electrodes. While the yields obtained heretofore have generally been considered reasonable, it is recognised that there is a need to improve further yield levels to achieve low cost, mass production of these display devices. A major factor in yield levels is the ability to fabricate TFTs having the necessary uniform operational characteristics in the large numbers required. Just one defective thin film transistor or a few transistors exhibiting slightly differing operational characteristics can render the display device unacceptable.

SUMMARY OF THE INVENTION

It is an object of the present invention to provide improved thin film transistors of the kind described above and suitable for use in display devices which leads to an improvement in yield being obtained.

According to a first aspect of the present invention there is provided a method of fabricating a TFT comprising the steps of forming on a substrate carrying a gate electrode, a multi-layer structure comprising, in superimposed relationship, a gate insulator layer, an intrinsic semiconductor layer which is to provide a channel, a doped semiconductor layer which is to form source and drain contact regions and a passivating layer, characterised in that the doped semiconductor layer is provided in the multi-layer structure as a layer extending over the channel region of the intrinsic semiconductor layer and in that a portion of the doped semiconductor layer overlying the region is subsequently converted into a highly resistive portion which separates the source and drain contact forming regions of that layer.

With this method, therefore, the intrinsic semiconductor layer, at least at the region thereof which is to form the channel, is covered by the layer which consists initially of doped (e.g. n+) semiconductor and which, at its region overlying the channel, is subsequently converted to a highly resistive form. This layer serves to protect the intrinsic layer. The doped semiconductor layer is in turn covered and protected by the passivating layer. The multi-layer structure can be built up in sequential processing operations conveniently in a single piece of processing equipment, for example plasma deposition equipment. It is not necessary to perform an etching operation until after this structure is fabricated. In other words, the need to transfer a partially built structure from one piece of equipment to another during processing is avoided. Thus it will be appreciated that during such fabrication of the multilayer structure the intrinsic semiconductor layer does not become exposed to possible contaminating sources such as air, etchants or the like.

It has been recognised that the exposure of critical interfaces to potential contaminants is likely to be a contributory cause of defects in known TFTs and, accordingly, constitutes a yield hazard. For example, in the first of the two known methods of fabricating TFTs described above, the n-type layer is etched away over the channel region prior to deposition of a passivation layer so that during fabrication the surface of the intrinsic layer by necessity is exposed. Similarly, in the second of the above-described known methods it is necessary to etch away selectively portions of the upper silicon nitride layer at the region of the source and drain contacts prior to depositing the n-type silicon layer so that, again, surface portions of the intrinsic silicon layer are exposed during fabrication, in this case adjacent the contact regions. The present invention enables such critical interface exposure of the intrinsic silicon to be avoided.

In a preferred embodiment, the semiconductor material comprises amorphous silicon or polysilicon, although other semiconductor materials, for example germanium or a silicon/germanium alloy, may be used instead.

The region of the doped semiconductor layer is conveniently converted to a high resistance region by a compensating doping implant. Thus, in one example, a p-type compensating implant is introduced into a doped semiconductor layer of n-type material. Alternatively, the compensating doping implant may take the form of ion isolation, using for example protons, as a result of which defects are produced which trap carriers in that region. The compensating implantation may be performed prior to deposition of the passivating layer but is preferably done after such deposition. Doping compensation is relatively easy to achieve, particularly in the case of an intrinsic layer comprising amorphous silicon, because for net ion doping levels of about $10^{18}/cm^3$ or less the resulting resistivity is very high. In order to ensure that this compensating implant is carried out most effectively, this step may be undertaken at a stage in the fabrication process following the deposition and definition of the metal source and drain contacts and utilising these contacts for masking purposes. More particularly, the source and drain contacts may be formed by etching windows in the passivating layer to expose respective portions of the doped semiconductor layer and thereafter depositing contact material within and around those windows.

The doped semiconductor layer may be formed over the intrinsic semiconductor layer as a separately deposited layer. Alternatively, the doped semiconductor layer may be formed by conversion of a thickness of the intrinsic layer. This may be achieved by a n-type implantation process.

The provision of a converted doped semiconductor region over the channel in the resultant TFT provides a further advantageous effect in that the compensated region serves to reduce unwanted photoconduction in the channel region. Photoconduction can be a serious problem with TFTs used as switching elements in display devices such as LC-TVs and a reduction in this effect in TFTs used for such purposes is therefore highly beneficial.

According to a second aspect of the present invention there is provided a TFT comprising an intrinsic semiconductor layer which extends over, and is insulated from, a gate electrode on a substrate and which provides a channel region, doped semiconductor material overlying the intrinsic silicon layer and defining discrete source and drain contact regions adjacent respective ends of the channel region, which is characterised in that semiconductor material providing the source and drain contact regions extends as a layer also over the channel region with a portion thereof which separates the doped contact regions being resistive so as to inhibit conduction between the contact regions in that layer.

The layer of semiconductor material thereby serves to cover and protect the intrinsic semiconductor forming the channel region. In addition, the portion of this layer which overlies the channel region can serve to reduce significantly undesired photoconductive effects in the channel region by serving to recombine photo-induced carriers.

The TFT preferably further includes a passivating layer which extends over the layer of semiconductor material and which is provided with windows through which source and drain contacts extend onto the doped source and drain contact regions of this layer. As these windows open onto the semiconductor material layer and this layer, in turn, covers the intrinsic semiconductor layer, contamination of the intrinsic layer by air, etchants, or the like during and after fabrication can be avoided.

As previously described, the semiconductor material layer at the contact regions and the intermediate portion can initially comprise doped semiconductor with the resistive region thereof being formed by a compensating implant, advantageously after definition of metal source and drain contacts and using these contacts as a mask.

In a preferred embodiment, the semiconductor material comprises amorphous silicon. In another embodiment, polysilicon may be used. It is envisaged, however, that other semiconductor materials might be used to form the semiconductor material layer and intrinsic layer as will be apparent to persons skilled in the art.

According to a third aspect of the present invention an electro-optical display device, for example a liquid crystal display device, comprising an array of display elements, each of which is controlled via a switching element, is characterised in that the switching elements comprise thin film transistors according to the second aspect of the invention or manufactured in accordance with the first aspect of the present invention.

BRIEF DESCRIPTION OF THE DRAWINGS

Thin film transistors, their method of manufacture and display devices using such thin film transistors in accordance with the invention will now be described, by way of example, with reference to the accompanying drawings in which:

FIG. 3 illustrates graphically the relationship between gate voltage and leakage and "on" current under illumination for a TFT manufactured in accordance with the invention and, for comparison, a known TFT;

FIG. 4 shows schematically in plan view a typical display element of an active matrix addressed liquid crystal display device in accordance with the invention together with its associated TFT and address conductors; and FIG. 5 is a cross-sectional view along the line V—V of FIG. 4.

DESCRIPTION OF THE DRAWINGS

Figure 1A:
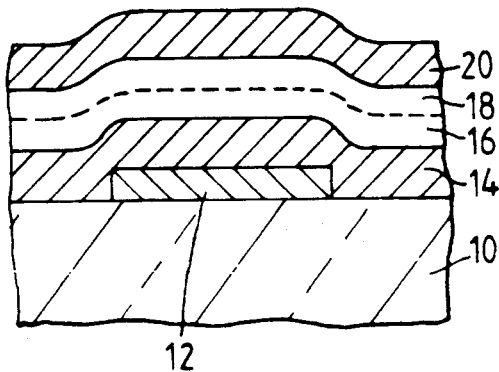
FIGS. 1a and 1b are cross-sectional schematic views, not to scale, through a first embodiment of TFT at different stages in its fabrication.
Figure 1B:
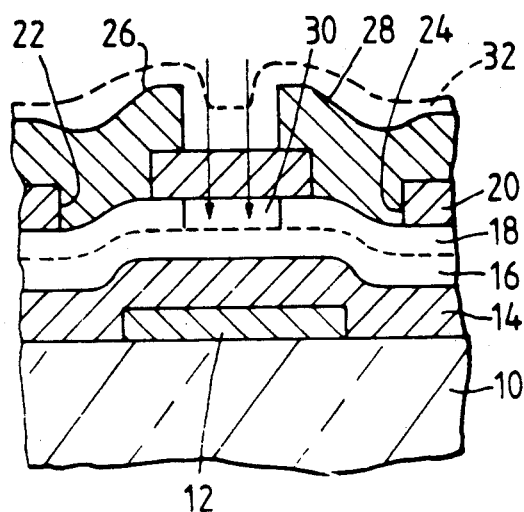

Referring to FIGS. 1a and 1b, the first embodiment of field effect TFT is fabricated by depositing sequentially directly superimposed layers onto a substrate 10 carrying a pre-defined gate electrode, 12. The substrate 10 may be of any suitable insulative material, for example glass. The gate electrode comprises chromium, although other suitable metals may be employed.

The multi-layer structure formed over the gate electrode comprises, in the following order, a layer 14 of silicon nitride (a—$Si_3N_4$:H), part of which overlying the electrode 12 is to serve as gate dielectric, a layer 16 consisting of intrinsic amorphous silicon (a-Si:H) in which a channel region is to be defined, a doped n+ type amorphous silicon layer 18 (n+a-Si:H) (using, for example, phosphorus as the dopant) from which source and drain contact regions are to be provided, and a layer 20 comprising passivating silicon nitride. The layers 14, 16. 18 and 20 are all formed by standard growth techniques. This multi-layer structure is fabricated in successive stages within a suitable deposition equipment and without removal from the equipment at any stage during formation of the structure. Because the multi-layer structure is fabricated by a series of deposition steps in this single piece of equipment the possibility of contamination occuring between layers is reduced and good quality interfaces are achieved.

Referring now to FIG. 1b, the resulting multi-layer structure is then removed from the deposition equipment and subjected to a selective wet etch process (HF) to produce windows 22 and 24 as indicated which extend through the passivation layer 20 and expose upper surface portions of the n+ amorphous silicon layer 18. Thereater metal, for example chromium and/or aluminium is deposited by evaporation and defined to form source and drain contacts 26 and 28 contacting the doped silicon layer 18 towards either side of the region of this layer 18 which overlies the gate electrode 12. Alternatively a mixture of n+ amorphous silicon plus metal may be used for the source and drain contacts.

At this stage, the n+ type silicon layer 18 extends as a unitary and continuous layer completely between the windows 22 and 24 over the gate electrode 12 and the intervening region of the intrinsic amorphous silicon layer 16 constituting the channel region.

A compensating implant operation is then performed in which additional doping is introduced into a region of the layer 18 overlying the gate electrode 12 as indicated by the arrows in FIG. 1b, using edges of the source and drain contacts 26 and 28 as a mask, followed by an anneal. The dopant used comprises a suitable p+ type dopant such as boron and is introduced at a selected level (concentration) which renders the portion of the layer 18 subjected to this implantation, designated 30 in FIG. 1b, sufficiently highly resistive to inhibit any significant conduction between the regions of the n+ layer 18, separated by this portion 30. It is seen, therefore, that this compensating implant operation serves to define and separate, both physically and electrically, facing edges of source and drain n+ type regions in the layer 18. The source and drain regions thus formed lie adjacent opposite ends of an intermediate region of the intrinsic layer 16 directly beneath the compensated portion 30 which intermediate region serves as the channel region of the transistor.

Compensation in the portion 30 of the layer 18 can be achieved relatively easily in amorphous silicon because traps inhibit conduction at low net ion doping levels. With ion doping levels of $10^{18}/cm^3$ or less the resistivity obtained is very high and entirely adequate for the purpose of inhibiting conduction between the source and drain contacts via the compensated portion 30.

Using the above-described method, critical interface exposure of the intrinsic silicon layer 16 at the areas of the eventual source and drain contact regions and channel region to possible contaminants such as air, dirt or etchants is avoided. As a result higher reliability, improved performance, and a greater degree of reproducibility and uniformity in the operational characteristics of TFTs so produced can be expected.

The n+ type material at the source and drain contact regions gives good injecting properties for the source/-drain contacts and has been shown to reduce current crowding effects as well as improving uniformity and reproducibility.

By way of example, the thicknesses of the intrinsic layer 16 and gate insulator layer 16, may be approximately 0.1 and 0.4 micrometers respectively. The n+ type layer 18 has a thickness of approximately 0.08 micrometers and the channel region dimensions, being generally rectangular in this embodiment, of around 8 micrometers in length by 40 micrometers in width. The resulting TFT has a threshold voltage (VT) of approximately 2.5 V and a mobility of 0.4 $cm^2 V^{-1} s^{-1}$. The characteristics do not change significantly as the intrinsic layer thickness is varied in the range 0.1 to 0.4 micrometers, except for a small increase in off-current as the layer thickness is increased.

The TFT has a further important advantage in that the compensated portion 30 serves to reduce undesirable photoconduction effects in the adjacent channel region by acting to recombine photo-induced carriers produced in the channel region. This is illustrated in FIG. 3 which shows, curve I, the relationship between gate voltage $V_G$ (volts) and leakage and "on" current IL (amps) under conditions of illumination at $4 \times 10^4$ Lux for the above described TFT, compared with the relationship, curve II, for an equivalent form of known TFT, as described in the opening paragraphs.

Figure 2A:
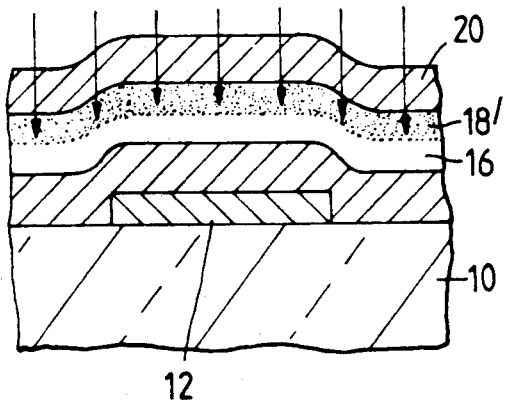
FIG. 2a and 2b are cross-sectional schematic views, not to scale, through a second embodiment of TFT at different stages in its fabrication.
Figure 2B:
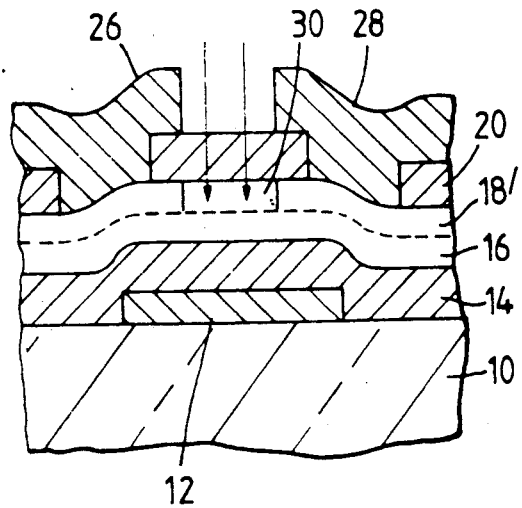

Turning now to FIGS. 2a and 2b, there is shown a second embodiment of a TFT according to the invention at different stages in its fabrication. This embodiment is similar in most respects to that described previously, except for the manner in which the n+ type layer is produced, and accordingly the same reference numbers have been used to designate corresponding parts.

Following deposition of the silicon nitride layer 14 over the gate electrode 12 on the substrate 10, the layer of intrinsic amorphous silicon 16 is deposited as before. In this method, however, the deposition stages are followed directly by the deposition of the further, passivating, layer of silicon nitride 20. Thereafter, to produce the multi-layer structure, an implantation operation using n type dopant, such as phosphorus, is carried out, as indicated by the arrows in FIG. 2a, through the layer 20 to convert an upper thickness only of the intrinsic layer 16 to n+ type material, referenced at 18', while the lower-thickness remains unaffected by this implant operation. These operations take place successively in a plasma deposition equipment without removal of the substrate at any stage. The doped silicon 18' extends as a continuous and unitary layer between regions eventually forming source and drain contact regions over the region of the intrinsic layer 16 which will constitute the channel.

Fabrication of the TFT is continued generally as described with regard to the previous embodiment by etching windows in the layer 20, depositing and defining metal (e.g. Cr and/or Al, or n+ a-Si plus metal) source and drain contacts, and performing a compensating ion implantation operation using p+ type dopant (such as boron) and using edges of the source and drain contacts as a mask followed by annealing, to convert the portion 30 of the sub-layer 18' to high resistance material for inhibiting conduction therethrough between the source and drain contact regions.

The devices shown in FIG. 1b and 2b my be provided with a secondary passivating layer extending completely over the structure, as shown, for example, in dotted outline at 32 in FIG. 1b. In a liquid crystal display device in which the TFT is used as a switching element for controlling an associate display element, this secondary passivating layer can comprise polyimide material which acts also as an orientation layer for the liquid crystal material in known manner.

In both of the above described embodiments, silicon oxide could be used instead of silicon nitride to form the layers 14. Moreover, as mentioned previously, it is envisaged other semiconductor materials may be used for the layers 16 and 18, for example, polysilicon.

A plurality of the described TFTs may easily be fabricated simultaneously in an array on a common substrate. In an electro-optical display device such as a liquid crystal, electrochromic or electroluminescent active matrix addressed display device in which the TFTs are used as display element switches, the TFTs are arranged in rows and columns alongside respective ones of the display elements with their drain contacts being connected to an associated display element electrode carried on the same substrate in known fashion. The gates of all TFTs in the same row are interconnected, as are the source contacts of all TFTs in the same column. The required interconnections between TFTs, consisting of sets of row and column address conductors, are established simultaneously with deposition of TFT metal layers. An electrode common to all dislay elements is carried on a further substrate spaced from the substrate carrying the TFTs with electro-optic material contained therebetween.

Such active matrix addressed display devices and their operation are well known and for this reason the following description of an example display device, and in particular an active matrix liquid crystal display device, will be kept brief.

FIG. 4 shows schematically and in plan a typical one of the display elements and its associated TFT of the display device. FIG. 5 is a cross-sectional view along the line V—V of FIG. 4.

The display element consists of a transparent ITO electrode 40 fabricated on the substrate 10 adjacent the intersection of a respective pair of row and column address conductors, 41 and 42, to which gating and data signals respectively are supplied in operation. The TFT, here designated 44, is connected between the electrode 40 and the address conductors with its gate 12 connecting to the row conductor 41, its source 26 comprising part of the column conductor 42, and its drain 28 connected by an integrally-formed extension 45 to the electrode 40. The electrode 40 is formed directly on the substrate 10 before deposition of the gate electrode and the nitride material constituting the gate insulator layer 14, this material extending over the electrode 40 as well. A contact pad 46 is formed simultaneously with the gate 12 on the electrode 40. A window is etched through the nitride material 14 prior to metallisation so that the extension 45 contacts the pad 46.

The display device includes a further transparent substrate, 47, for example of glass, carrying an ITO electrode 48 common to all display elements with the space between this electrode and the TFTs 44 and display element electrodes 40 on the substrate 10 being filled with liquid crystal material 55.

The surfaces of the structure on the substrate 10 and the common electrode 48 are each covered by a polyimide layer, 50 and 51 respectively, acting as an alignment layer for the LC material. The layer 51 serves also as a secondary passivation layer for the TFTs 44.

It is envisaged that various modifications can be made to the specific examples of TFTs given above. For example, although the gate, the gate insulator and passivation layers, and the source and drain contacts have ben described as consisting of particular materials, other suitable materials may instead be employed as will be apparent to persons skilled in the art.

I claim:

1. A method of fabricating a TFT comprising the steps of
   (a) forming a gate electrode on a substrate;
   (b) forming a multi-layer structure over said gate electrode on said substrate, said multi-layer structure including in superimposed relationship:
      a gate insulator layer,
      an intrinsic semiconductor layer providing a channel region,
      a doped semiconductor layer extending over said channel region, and
      a passivating layer;
   (c) forming windows in said passivating layer to expose respective underlying areas of said doped semiconductor layer, said windows being above said doped semiconductor layer at respective sides of said gate electrode;
   (d) depositing contact material into said windows to form source and drain contacts, and
   (e) implanting further dopants into said doped semiconductor layer through said passivating material by using said contact material in said windows as a mask, said further dopants converting said doped semiconductor layer between said contact material into a high resistance region, said high resistance region being above said gate electrode.

2. A method according to claim 1, wherein said intrinsic semiconductor layer and said doped semiconductor layer are formed in step (b) of amorphous silicon.

3. A method according to claim 1, wherein said intrinsic semiconductor layer and said doped semiconductor layer are formed in step (b) of polysilicon.

4. A method according to claim 1, wherein step (b) is carried out by sequentially depositing said intrinsic semiconductor layer and said doped semiconductor layer as separate layers.

5. A method according to claim 1, wherein step (b) is carried out by doping a thickness of said intrinsic semiconductor layer to form said doped semiconductor.

* * * * *